(12) United States Patent
Burinskiy

(10) Patent No.: US 8,446,187 B1
(45) Date of Patent: May 21, 2013

(54) APPARATUS AND METHOD FOR POWER-ON RESET CIRCUIT WITH CURRENT COMPARISON

(75) Inventor: Alexander Burinskiy, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/941,858

(22) Filed: Nov. 16, 2007

(51) Int. Cl.
*H03L 7/00* (2006.01)
*H03K 3/02* (2006.01)

(52) U.S. Cl.
USPC .......................... 327/143; 327/142; 327/198

(58) Field of Classification Search
USPC .................. 327/142, 143, 198, 383
See application file for complete search history.

(56) References Cited

U.S. PATENT DOCUMENTS

| | | | |
|---|---|---|---|
| 5,159,217 A | 10/1992 | Mortensen et al. | |
| 5,302,861 A | 4/1994 | Jelinek | |
| 5,323,067 A | 6/1994 | Shay | |
| 5,451,896 A * | 9/1995 | Mori | 327/543 |
| 5,510,741 A | 4/1996 | Childs | |
| 5,565,807 A | 10/1996 | Ward | |
| 5,617,048 A | 4/1997 | Ward et al. | |
| 6,137,324 A | 10/2000 | Chung | |
| 6,452,414 B1 | 9/2002 | Lorenz | |
| 6,472,912 B1 * | 10/2002 | Chiu et al. | 327/143 |
| 6,515,523 B1 | 2/2003 | Bikulcius | |
| 6,853,221 B1 | 2/2005 | Wert | |
| 6,879,194 B1 | 4/2005 | Caldwell | |
| 6,894,537 B1 | 5/2005 | Wert | |
| 7,015,732 B1 | 3/2006 | Holloway et al. | |
| 2003/0227306 A1 * | 12/2003 | Di Iorio | 327/143 |
| 2005/0140406 A1 * | 6/2005 | Rizzo et al. | 327/143 |
| 2005/0264365 A1 * | 12/2005 | Takahashi | 330/296 |
| 2007/0001721 A1 * | 1/2007 | Chen et al. | 327/143 |

OTHER PUBLICATIONS

Katyal, A.; Bansal, N., A Self-Biased Current Source Based on Power-On Reset Circuit for On-Chip Applications, VLSI Design, Automation and Test, 2006 International Symposium, [pp. 1-4] Apr. 2006.

Lai Xinquan; Yu Weixue; Ligang; Cao Yu, A Low Quiescent Current and Reset Time Adjustable Power-on Reset Circuit, ASIC, 2005, ASICON 2005, 6th International Conference, vol. 2, [pp. 559-562], Oct. 24-27, 2005.

Wadhwa, S.K.; Siddhartha, G.K.; Gaurav, A., VLSI Design, 2006, Held jointly with 5th International Conference on Embedded Systems and Design, 19th Conference, [6 pgs.], Jan. 3-7, 2006.

Yasuda, T.R.; Yamamoto, M.; Nishi, T., A Power-on Reset Pulse Generator for Low Voltage Applications, Circuits and Systems, 2001, ISCAS 2001, The 2001 IEEE International Symposium, vol. 4, [pp. 599-601], May 2001.

Toumazou, C. et al., "Analogue Design IC: The Current-Mode Approach," Peter Peregrinus, Ltd., London, United Kingdom, p. 76, 11 pages.

* cited by examiner

*Primary Examiner* — Lincoln Donovan
*Assistant Examiner* — Colleen O Toole
(74) *Attorney, Agent, or Firm* — Eugene C. Conser; Wade J. Brady, III; Frederick J. Telecky, Jr.

(57) ABSTRACT

A power-on reset (POR) circuit is provided. The POR circuit includes a first current source, a second current source, and a current comparator. The first current source is arranged to provide a relatively supply-independent circuit. The second current source is arranged to provide a supply-dependent current. The current comparator is arranged to compare the relatively supply-independent circuit with the relatively supply-dependent current to provide a POR signal.

13 Claims, 5 Drawing Sheets

APPARATUS AND METHOD FOR POWER-ON RESET CIRCUIT WITH CURRENT COMPARISON

FIELD OF THE INVENTION

The invention is related to power-on reset (POR) circuitry, and in particular but not exclusively, to an apparatus and method for generating a POR signal by comparing a relatively supply-independent current to a current that varies based on the supply voltage.

BACKGROUND OF THE INVENTION

Typical microelectronic systems have various electronic components that often share one or more common biasing circuits. Examples of circuits that have common biasing arrangements may include current sources, operational amplifiers, comparators, as well as other various analog and digital functions. The various circuit functions may operate in a predictable fashion when the biasing circuits reach steady-state operation. However, stable operation of the various circuit functions can be delayed as a result of start-up transients and other conditions that occur when power is initially applied to the circuit. In digital circuits, it is possible that a digital logic circuit may find a trapped state or other undetermined condition during power-up. Similarly, analog circuits may reach a condition where transistors lock themselves in an off condition during power.

Various power-on detector circuits are used in electronic systems to ensure that a stable operating power-up condition has been achieved. Start-up circuits and power-on reset (POR) circuits can be used to initialize circuits and otherwise stabilize the operating conditions of various circuits. A POR signal is often asserted during an initial power-up sequence until some minimal operational criteria is achieved. Logic initialization problems can be avoided by incorporating reset circuits that are held active while a POR signal is asserted. Also, one or more nodes in various circuits can be initialized to a desired operation condition while the POR signal is asserted. Once the POR signal changes states, the various circuit functions can be presumed to be operating in a predictable fashion.

BRIEF DESCRIPTION OF THE DRAWINGS

Non-limiting and non-exhaustive embodiments of the present invention are described with reference to the following drawings, in which.

DETAILED DESCRIPTION

Figure 1:
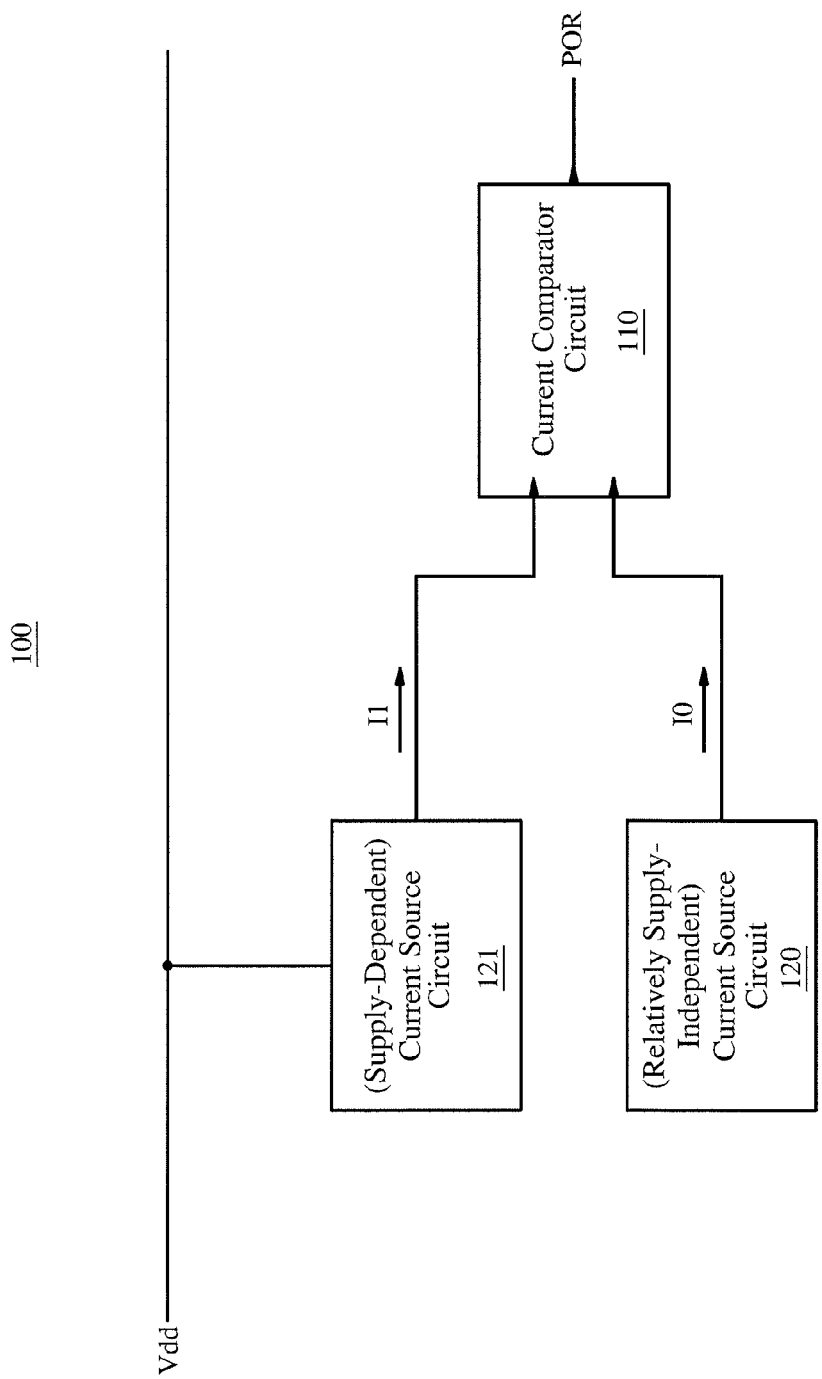
FIG. 1 shows a block diagram of an embodiment of a POR circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a power-on reset (POR) circuit that includes a first current source, a second current source, and a current comparator. The first current source is arranged to provide a relatively supply-independent circuit. The second current source is arranged to provide a supply-dependent current. The current comparator is arranged to compare the relatively supply-independent circuit with the relatively supply-dependent current to provide a POR signal.

FIG. 1 shows a block diagram of an embodiment of POR circuit 100. Circuit 100 includes current source circuit 120, current source circuit 121, and current comparator circuit 110.

Current source circuit 120 is arranged to provide current I0, a current that is relatively independent of power supply voltage Vdd. Current source circuit 121 is arranged to provide current I1, a current that varies based on power supply voltage Vdd. In one embodiment, current I1 is approximately proportional to Vdd.

In one embodiment, current comparator 110 is arranged to provide signal POR based on a comparison of current I0 and current I1. In other embodiments, current comparator 110 provides, at its output, a current comparison output voltage based on the comparison, and signal POR is provided based, in part, on the current comparator output voltage. For example, in one embodiment, the current comparison output voltage is provided to the input of an inverter, and the output of the inverter is signal POR.

Figure 4:
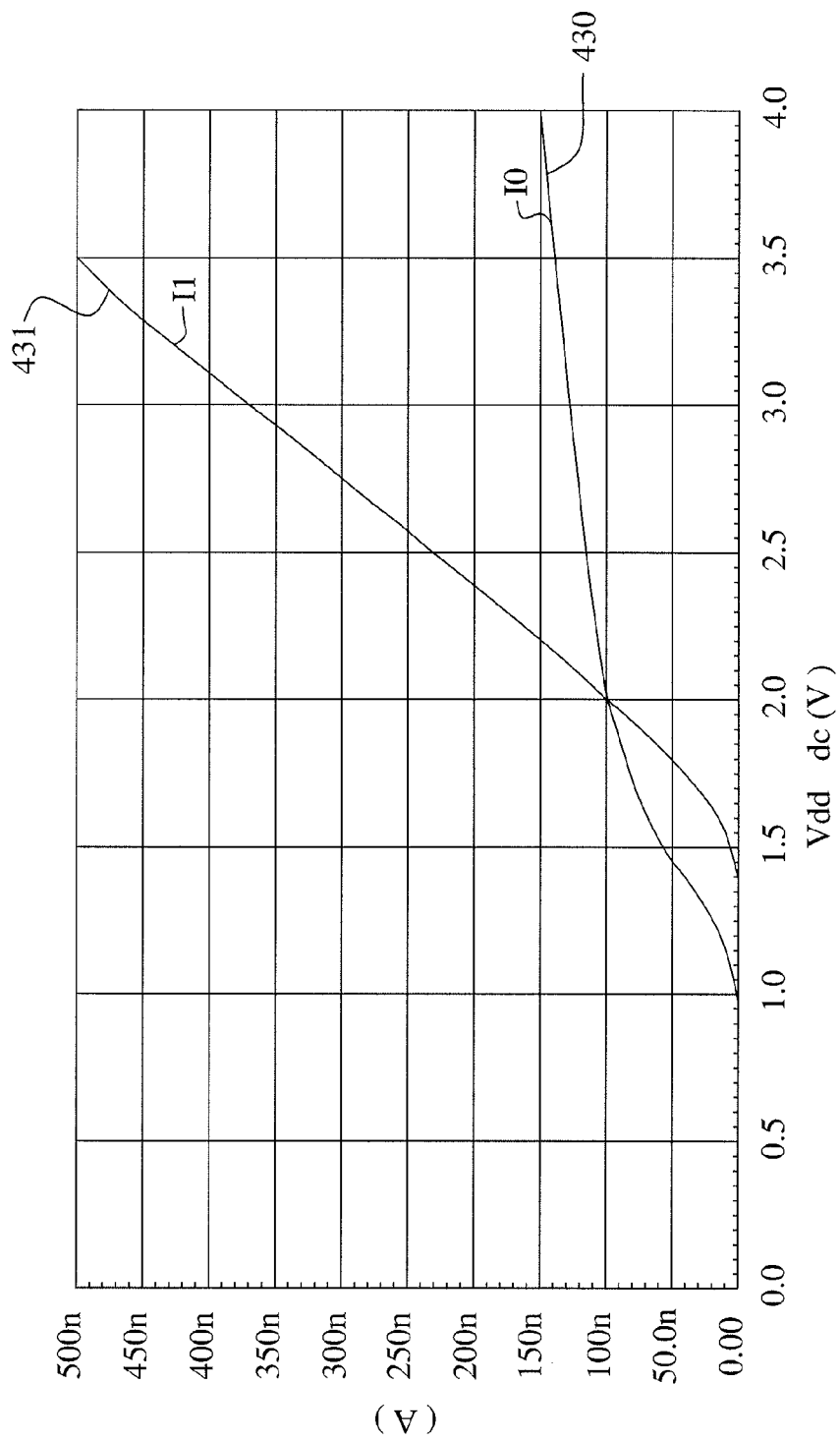
FIG. 4 illustrates a timing diagram of waveforms of embodiments of the current I0 and current I1 for an embodiment of the circuit of FIG. 3.

In one embodiment, after power-up begins, Vdd is 0V, and ramps upward to a final value. Currents I0 and I1 are approximately equal at a pre-determined value for voltage Vdd. When current I0 and I1 become equal, the current comparison output signal changes states, causing signal POR to be unasserted. The comparison includes hysteresis in some embodiments. FIG. 4 below shows an embodiment of the current crossing I0 and I1 in one embodiment, which is discussed in greater detail below. In the embodiment illustrated in FIG. 4, current I0 and I1 become equal when signal Vdd is approximately 2.1V. In other embodiments, other suitable values for the current crossing may be employed.

Figure 2:
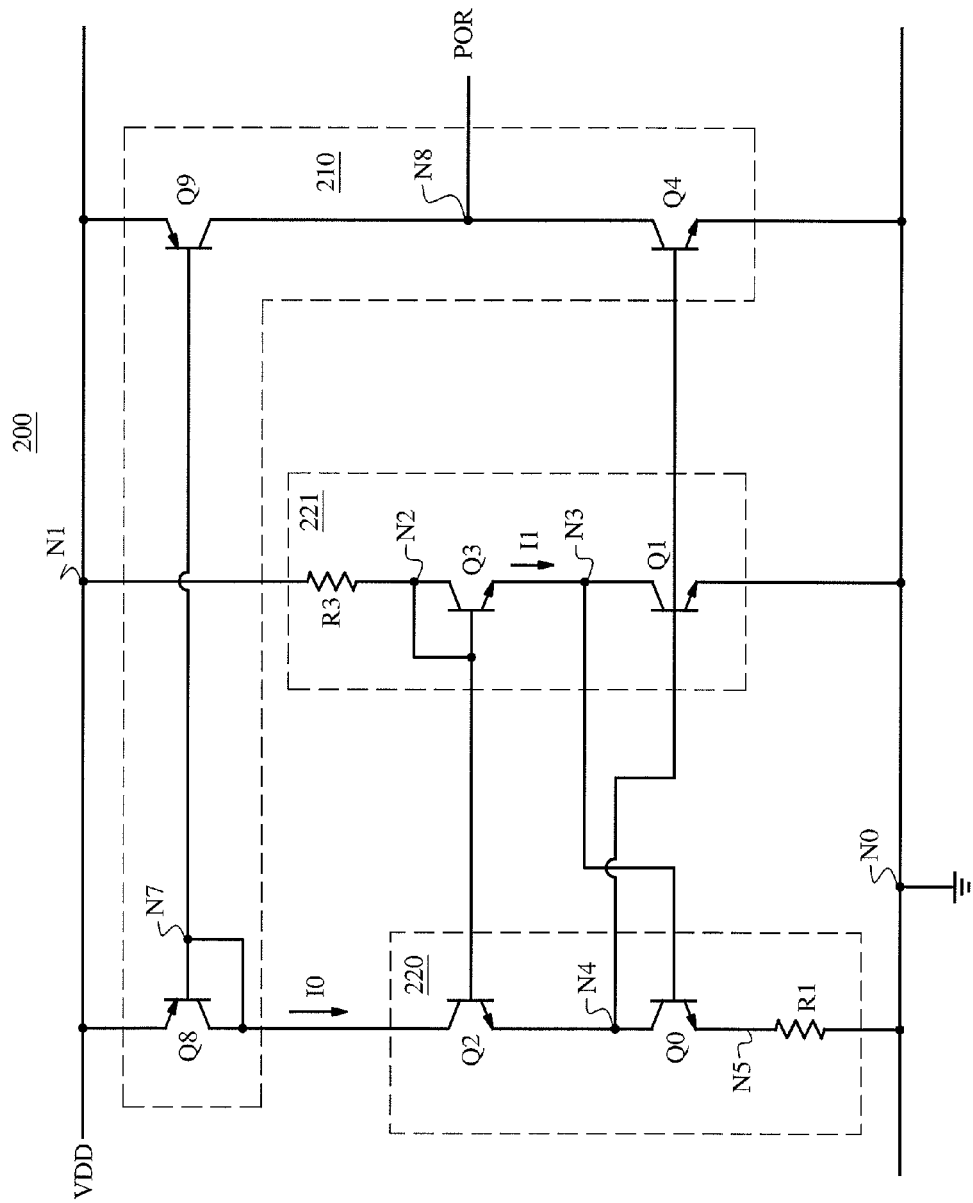
FIG. 2 illustrates a block diagram of an embodiment of the POR circuit of FIG. 1.

FIG. 2 illustrates a block diagram of an embodiment of POR circuit 200, which may be employed as an embodiment of POR circuit 100 of FIG. 1. Current source circuit 220 includes transistor Q0, transistor Q1, and resistor R1. Current source circuit 221 includes transistor Q1, transistors Q3, and resistor R3. Current comparator 210 includes transistors Q4, Q8, and Q9.

In the embodiment shown, current source 221 is arranged to provide current I1 such that current I1 is substantially given by $I1=(VDD-Vbe_{Q3}-Vbe_{Q1})/R3$ at the cross point. Also, in the embodiment shown, current source 220 is arranged to provide current I0 such that current I0 is substantially given by $I0=(Vbe_{Q0}-Vbe_{Q1})/R3$.

Transistors Q8 and Q9 form a current mirror that is arranged to mirror current I0, and transistors Q1 and Q4 form a current mirror that mirrors current I1. Transistors Q4 and Q9 are arranged to compare the mirrored currents, so that the mirrored versions of current I0 and I1 are compared.

Figure 3:
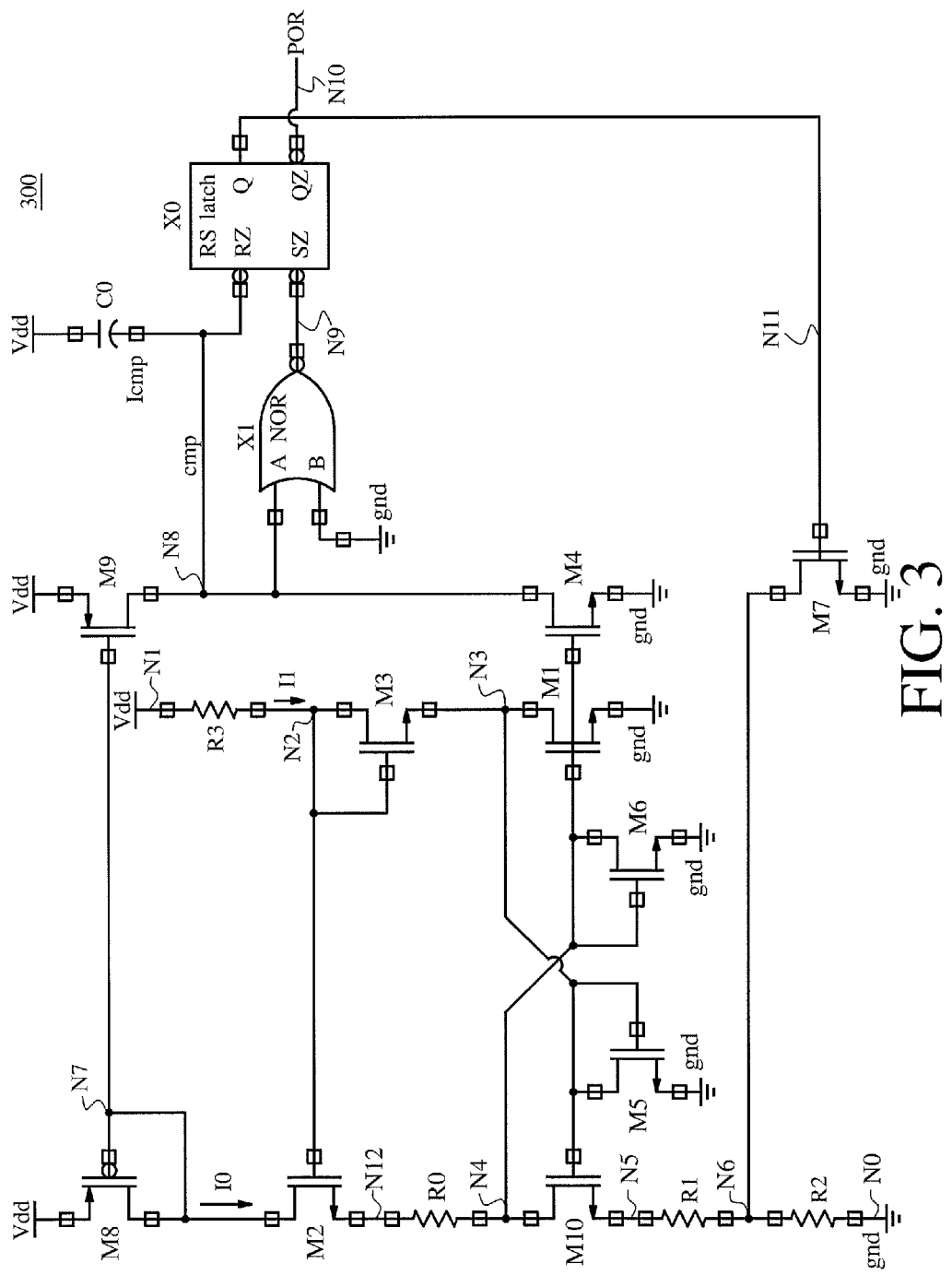
FIG. 3 shows a block diagram of an embodiment of the circuit of FIG. 2.

FIG. 3 shows a block diagram of an embodiment of circuit 300, which is an embodiment of circuit 200 of FIG. 2. In circuit 200, MOSFETs are used in place of bipolar transistors. Accordingly, transistors Q0, Q1, Q3, Q4, Q8 and Q9 are replaced by transistors M0, M1, M3, M8, and M9, respectively. Circuit 300 further includes resistor R1, capacitor C0, nor gate X1, RS latch X0, and transistors M5, M6, and M7.

Transistors M2, M0, M1, and M3 provide translinear quad. Transistors M5 and M6 provide initial start-up current since MOSFETs are being used in circuit 300 rather than bipolar transistors, and allow for proper operation in the sub-threshold region. Also, transistor M7 and resistor R2 provide hysteresis for the current comparison.

Voltage CMP at node N8 drives NOR gate X1, which is arranged as an inverter, and RS latch X1. Further, NOR gate X1 enables proper operation in the subthreshold region when supply voltage VDD is less then maximum of PMOS and NMOS threshold voltages. In one embodiment, resistors R1 and R2 are each a high resistivity poly-silicon resistor with a negative temperature coefficient. In one embodiment, resistor R0 is diffusion resistor and it has positive temperature coefficient, and resistor R0 provides temperature coefficient correction for supply threshold voltage. Capacitor C0 delays signal POR switching to indicate good supply if supply voltage grows too fast, thus limiting minimum pulse width. Also, transistor M7 shunts resistor R2 while POR is low.

At the cross point, neglecting resistor R0, currents I1 and I0 may be substantially given by:

$$I1=(Vdd-Vgs_{M3}-Vgs_{M1})/R3$$

$$I0=(Vgs_{M0}-Vgs_{M1})/R1, \text{ where}$$

Accordingly, current I1 is nearly proportional to Vdd–2Vtn, where Vtn represents the threshold voltages of the NMOSFETs, while I0 stays substantially supply-independent. Initially, while supply voltage Vdd is below the cross point, current I1<I0. Current I0 is mirrored into node N8 by current mirror M8/M9 and current I1 is mirrored by current mirror M1/M4. At node N8, currents I1, I0 are compared with each other. Accordingly, while supply voltage Vdd is below the cross point, voltage CMP stays high and voltage POR stays low. As Vdd ramps upward, current I1 also ramps upward. Eventually I1 reaches I0 and voltage CMP becomes low, while POR goes high, indicating "good supply". This means that Vdd>Vth, where Vth is threshold voltage for the circuit. At a moment Vdd=Vth, when voltage CMP changes state, transistors M7 opens, releasing resistor R2 and thus lowering current I0. That acts as a positive feedback at the moment of switching, thereby increasing speed of transition from one state to another state and also provides hysteresis for the circuit. This way, the transition from "good supply" when voltage POR is high to "bad supply" when POR stays low happens at a lower voltage than the transition from "bad supply" to "good supply".

Capacitor C0 is charged by difference current I1-I0 at node N8 while transitioning from one state to another state. This provides delay for transition, enabling reliable "power on reset" signal when supply voltage grows too fast.

The arrangement of NOR gate X1 and RS latch X0 enables proper operation for supply voltages Vdd<2Vtn, where Vtn is threshold voltages of the NMOS transistors. In the subthreshold region, a classic NOR gate has proper leakage current ratio suitable for operation of POR circuit 100. Using a NOR gate also reduces shoot-through current compared with a classic inverter during the transition. Further, RS latch X0 sharpens rise and fall fronts of voltage POR.

The threshold voltage Vth may be adjusted by proper selection of the ratio R3/R1 and hysteresis could be adjusted by R1/R3.

FIG. 4 illustrates a timing diagram of waveforms 430 and 431 of embodiments of the current I0 and current I1 respectively for an embodiment of circuit 300 of FIG. 3. For purposes of simplification, FIG. 4 is shown with the hysteresis disabled. As shown, current I0 is relatively independent of supply voltage Vdd. Current I1 is nearly proportional to Vdd–2Vtn. Current I0 and current I1 cross at about 2.1V, so that Vth is about 2.1V in the embodiment shown. Threshold Vth may be adjusted by adjusting the ratio R3/R1, or other circuit parameters.

Figure 5A:
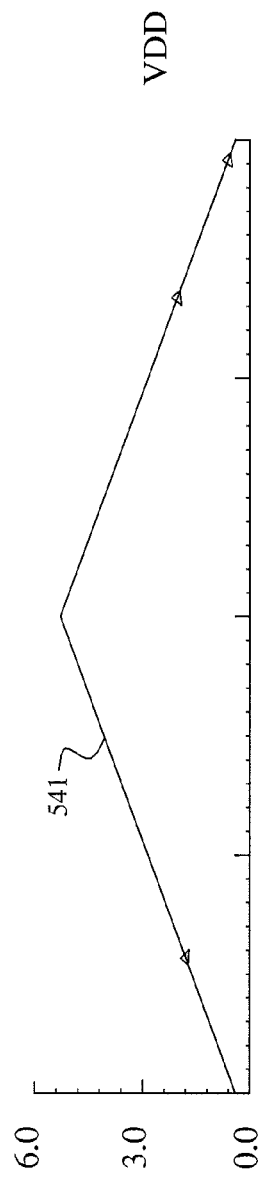
FIGS. 5A-5C shows a timing diagram of waveforms of embodiments of other signals for an embodiment of the circuit of FIG. 3, in accordance with aspects of the present invention.
Figure 5B:
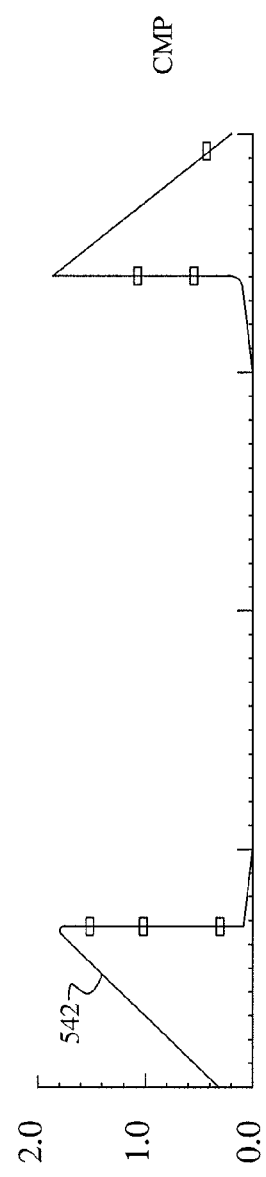
Figure 5C:
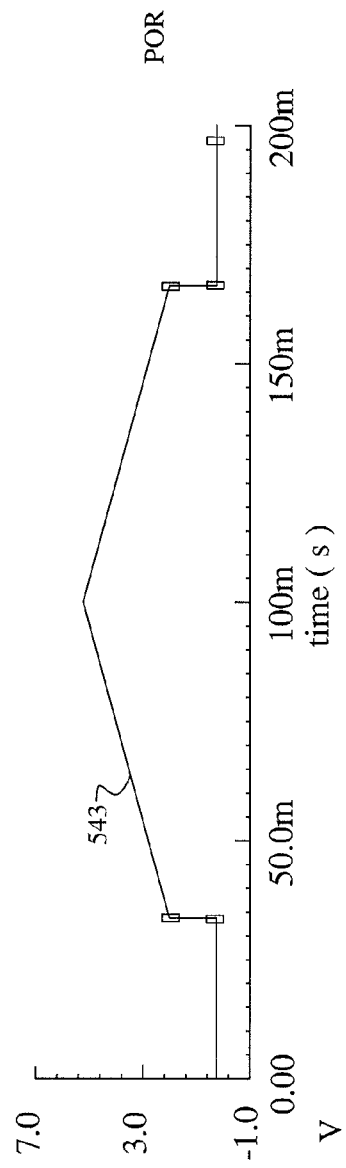

FIGS. 5A-5C shows a timing diagram of waveforms 541, 542, and 543 of embodiments of supply voltage VDD, voltage CMP, and voltage POR, for an embodiment of circuit 300 of FIG. 3. As shown, while supply voltage VDD is less than Vth, voltage CMP is high (approximately equal to Vdd), and voltage POR is low. While supply voltage VDD is greater than the threshold voltage VDD, voltage CMP is low, and voltage POR is high.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for power-on detection, comprising:
   a power-on reset circuit that is arranged to provide a power-on reset signal such that the power-on reset signal is unasserted approximately when a power supply voltage reaches a predetermined level, wherein the power-on reset circuit includes:
   a first current source circuit that is arranged to provide a first current such that the first current varies based on the power supply voltage;
   a second current source circuit that is arranged to provide a second current such that the second current is substantially independent of the power supply voltage; and
   a comparison circuit that is arranged to compare the first current to the second current, and to provide a comparison output signal based on the comparison, wherein the power-on reset signal is based, at least in part, on the comparison output signal, wherein the power-on reset circuit is arranged to receive the power supply voltage at a first node;

the first current source includes:
a first transistor having at least a gate, a drain, and a source, wherein the drain of the first transistor is coupled to a second node, and the source of the first transistor is coupled to a third node; and
a second transistor having at least a gate, a drain, and a source, wherein the drain of the second transistor is coupled to the third node,
a first resistor that is coupled between the first node and the second node, wherein the first resistor is arranged to received the power supply voltage at the first node, wherein the first current is the current through the first resistor, and
wherein the gate of the first transistor is coupled to the second node, and
the second current source includes:
a third transistor having at least a gate, a drain, and a source, wherein the gate of the third transistor is coupled to the third node, the drain of the third transistor is coupled to a fourth node, and the gate of the second transistor is coupled to the fourth node;
wherein the source of the third transistor is coupled to a fifth node;
the second current source further includes:
a second resistor that is coupled between the fifth node and a sixth node, wherein the second current is the current through the second resistor,
wherein the second current source further includes:
a fourth transistor having at least a gate, a drain, and a source; wherein the gate of the fourth transistor is coupled to the second node, the drain of the fourth transistor is coupled to a seventh node, and the source of the fourth transistor is coupled to the fourth node,
wherein the second current source further includes:
a third resistor that is coupled between the source of the fourth transistor and the fourth node, such that the source of the fourth transistor is coupled to the fourth node via the third resistor,
wherein the third resistor is a diffusion resistor, and
wherein the third transistor has a positive temperature coefficient.

2. The circuit of claim 1, wherein the comparison circuit is arranged to provide the comparison output signal at a node, wherein the comparison circuit includes:
a first current mirror that is arranged to mirror the first current to the node; and
a second current mirror that is arranged to mirror the second current to the node, such that a voltage at the node is pulled high or low depending on whether the first current or second current is greater.

3. The circuit of claim 1, wherein the second current source is arranged to provide the second current such that the second current is approximately proportional to the difference between a gate-to-source voltage of the third transistor and a gate-to-source voltage of the fourth transistor.

4. The circuit of claim 1, wherein the second current source is arranged to provide the second current such that the second current is approximately proportional to the difference between a base-to-emitter voltage of the third transistor and a base-to-emitter voltage of the fourth transistor.

5. The circuit of claim 1, wherein the first current source is arranged to provide the first current such that the first current is approximately proportional to the power supply voltage.

6. The circuit of claim 5, wherein the first current source is arranged to provide the first current such that the first current is approximately proportional to Vdd-2*Vgs, where Vdd represents the power supply voltage, and where Vgs represents a gate-to-source voltage of a transistor or a base-to-emitter voltage of a transistor.

7. The circuit of claim 1, wherein the first transistor is a field effect transistor.

8. The circuit of claim 1, wherein the first transistor is a bipolar transistor, the gate of the first transistor is a base, the drain of the first transistor is a collector, and the source of the first transistor is an emitter.

9. The circuit of claim 1, wherein the current comparison circuit includes:
a fifth transistor having at least a gate, a drain, and a source, wherein the gate of the fifth transistor is coupled to the seventh node, the drain of the fifth transistor is coupled to the seventh node, and the source of the fifth transistor is coupled to the first node;
a sixth transistor having at least a gate, a drain, and a source, wherein the gate of the sixth transistor is coupled to the seventh node, the drain of the fifth transistor is coupled to an eighth node, and the source of the sixth transistor is coupled to the first node; and
a seventh transistor having at least a gate, a drain, and a source, wherein the gate of the seventh transistor is coupled to the fourth node, the drain of the seventh transistor is coupled to the eighth node, and wherein the comparison output signal is provided at the eighth node.

10. The circuit of claim 9, wherein the current comparison circuit further includes:
an inverter that is coupled between the eighth node and the ninth node, wherein the power-on reset signal is a voltage at the ninth node.

11. The circuit of claim 9, wherein the current comparison circuit further includes:
a NOR gate having at least a first input that is coupled to the eighth node, a second input that is coupled to a ground node, and an output that is coupled to a ninth node; and
an RS latch having at least a first input that is coupled to the eighth node, a second input that is coupled to the ninth node, a first output, and a second output that is coupled to a tenth node, wherein the power-on reset signal is a voltage at the tenth node.

12. The circuit of claim 11, wherein
the first output of the RS latch is coupled to an eleventh node,
the source of the second transistor is coupled to the ground node,
the source of the seventh transistor is coupled to the ground node, and
wherein the power-on reset circuit further includes:
an eighth transistor having at least a gate, a drain, and a source, wherein the gate of the eighth transistor is coupled to the eleventh node, the drain of the eight transistor is coupled to the sixth node, and the source of the third transistor is coupled to the ground node; and
a third resistor that is coupled between the sixth node and the ground node.

13. The circuit of claim 12, wherein the second resistor has a relatively high resistivity, the second resistor is a polysilicon resistor, the second resistor has a negative temperature coefficient, the third resistor has a relatively high resistivity, the third resistor is a poly-silicon resistor, and wherein the third resistor has a negative temperature coefficient.

\* \* \* \* \*